(12) United States Patent
Ohba et al.

(10) Patent No.: US 7,466,764 B2
(45) Date of Patent: Dec. 16, 2008

(54) DELAY REGULATING DEVICE

(75) Inventors: Takeshi Ohba, Kawasaki (JP); Yasuhito Funyu, Kawasaki (JP); Hideharu Shako, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/970,653

(22) Filed: Jan. 8, 2008

(65) Prior Publication Data

US 2008/0130798 A1 Jun. 5, 2008

Related U.S. Application Data (63) Continuation of application No. PCT/JP2005/013974, filed on Jul. 29, 2005.

(51) Int. Cl.
*H04L 25/49* (2006.01)

(52) U.S. Cl. ...................................... 375/296

(58) Field of Classification Search ............. 375/295, 375/296, 285, 297; 332/107, 106, 117, 123, 332/159, 149
See application file for complete search history.

(56) References Cited

U.S. PATENT DOCUMENTS 6,757,525 B1 6/2004 Ishikawa et al.
6,836,517 B2 * 12/2004 Nagatani et al. ............ 375/296
2005/0073361 A1 * 4/2005 Hamada et al. ............. 330/149
2007/0286307 A1 * 12/2007 Hayashi et al. ............. 375/297

FOREIGN PATENT DOCUMENTS

JP 2001-189685 7/2001
WO 03/103166 12/2003

OTHER PUBLICATIONS

International Search Report dated Oct. 25, 2005, from the corresponding International Application.

* cited by examiner

*Primary Examiner*—Tesfaldet Bocure
(74) *Attorney, Agent, or Firm*—Katten Muchin Rosenman LLP (57) ABSTRACT

In a delay regulating device, delay regulation is performed using a delay circuit performing delay regulation in a clock unit and a delay filter performing delay regulation in a tap unit smaller than the clock unit. The delay regulation is performed so as to obtain the maximum value of the correlation value and the minimum value of the error signal. First the delay circuit based on the clock unit is used to control the delay amount of the reference signal so as to obtain the maximum value of the correlation value. The delay filter is used to control the delay amount of the feedback signal so as to obtain the maximum value of the correlation value. Phase adjustment of the reference signal and the feedback signal is performed. The delay amount of the feedback signal is regulated so as to minimize the error signal unit using the delay filter.

9 Claims, 8 Drawing Sheets

FIG. 1
PRIOR ART

PRIOR ART

FIG. 2

PRIOR ART

PRIOR ART

F I G. 5

PRIOR ART

F I G. 6

PRIOR ART

FIG. 7

PRIOR ART

FIG. 8

DELAY REGULATING DEVICE

CROSS-REFERENCE TO THE RELATED APPLICATION

This application is a continuation application of the international patent application No. PCT/JP2005/13974, filed on Jul. 29, 2005.

BACKGROUND OF THE INVENTION

1. Field of the Invention

The present invention relates to a delay regulating device for a reference signal and a feedback signal in an adaptive predistorter (APD) type distortion compensation device.

2. Description of the Related Art

When distortion compensation is performed in the APD system, delay regulation is required to control timing between a reference signal (Ref signal) and a feedback signal (FB signal).

Figure 1:
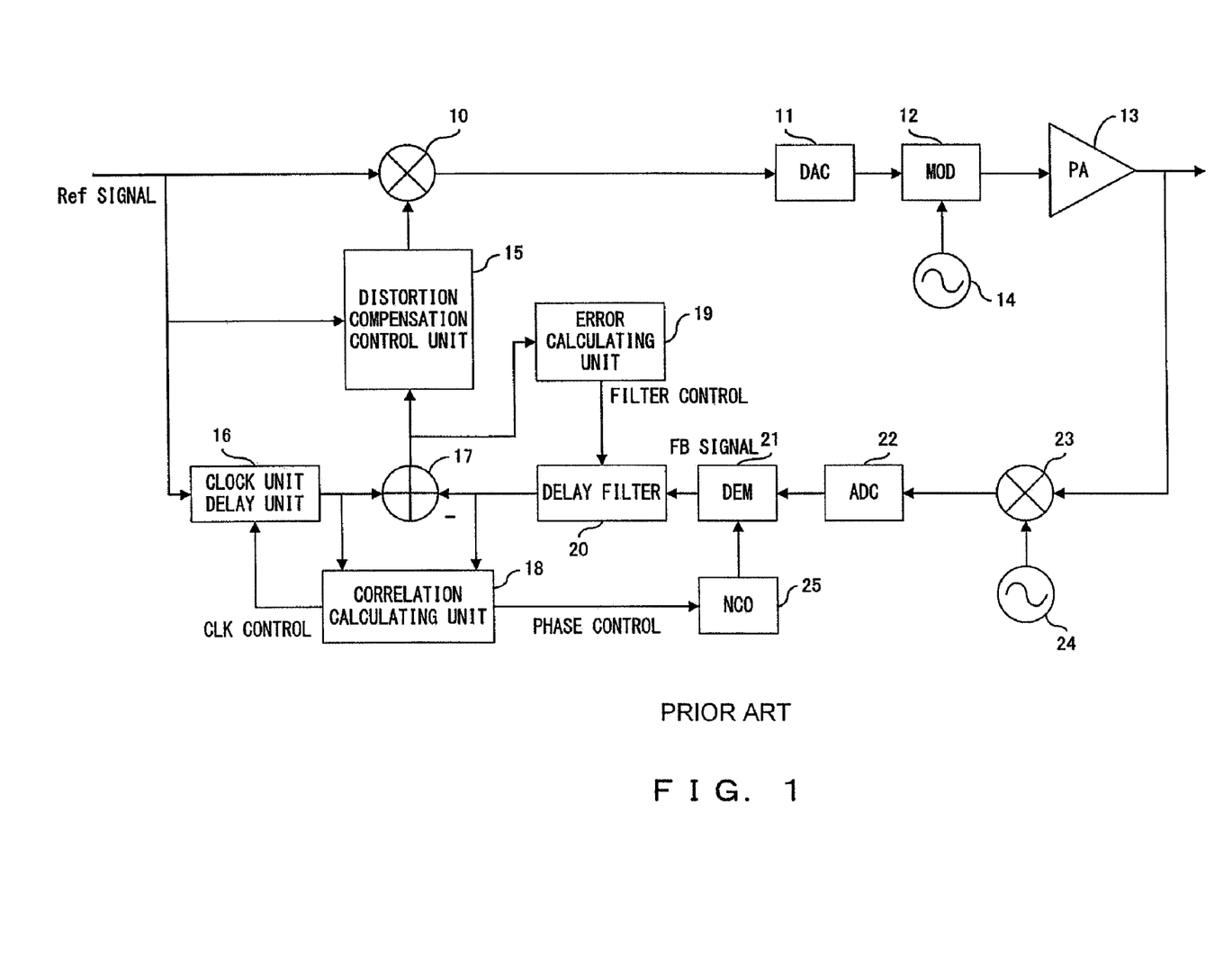
FIG. 1 is a block diagram of a transmission board using distortion compensation in an APD system.

FIG. 1 is a block diagram of a transmission board to which the distortion compensation in the APD system is applied.

The reference signal (Ref signal) is a baseband signal of a transmission signal. The reference signal is input to a multiplier 10, multiplied by a distortion compensation coefficient from a distortion compensation control unit 15, and input to a D/A converter 11. When the D/A converter converts a digital signal into an analog signal, a modulator 12 modulates the signal, and a power amplifier 12 amplifies and transmits the signal. The modulator receives a radio frequency for up-conversion from a local oscillator 14.

A reference signal is input to the distortion compensation control unit 15. The reference signal input to the distortion compensation control unit 15 is used to index a distortion compensation table. Furthermore, the reference signal is input to a clock unit delay unit 16. The reference signal is delayed by the clock unit delay unit 16 in a clock unit, and input to an adder 17 and a correlation calculating unit 18. The clock of the clock unit delay unit 16 is controlled by the correlation calculating unit 18, and an amount of delay by the clock unit delay unit 16 is controlled by controlling the clock.

The signal output from the power amplifier 12 is input to a multiplier 23 as a feedback signal (FB signal). The multiplier 23 multiplies the signal by a radio frequency from a local oscillator 24 for down-conversion. The output of the multiplier 23 is input to an A/D converter 22, and converted from an analog signal into a digital signal. The feedback signal converted into a digital signal is demodulated by a demodulator 21, and input to a delay filter 20. The delay filter 20 is typically a FIR filter, and can change the amount of delay of a signal by changing a tap coefficient. The output of the delay filter 20 is input to a negative terminal of the adder 17 and the correlation calculating unit 18. The correlation calculating unit 18 controls the phase of an oscillated wave of a numerical control oscillator 25 for inputting a periodical wave to the demodulator 21. The correlation calculating unit 18 calculates a correlation value between the reference signal and the feedback signal, and controls the clock unit delay unit 16 and the numerical control oscillator 25 such that the correlation value can be higher.

The adder 17 obtains a difference between the reference signal input to the adder 17 and the feedback signal input to the negative terminal of the adder 17, and inputs the result to the distortion compensation control unit 15 and an error calculating unit 19. The error calculating unit 19 adjusts the amount of delay of the delay filter 20 such that the output of the adder 17 can be lower. An error signal as output of the adder 17 is used for update of a distortion compensation coefficient of a distortion compensation table stored in the distortion compensation control unit 15.

The conventional adjustment of a relative amount of delay between a feedback signal and a reference signal is performed in the following two steps.

(1) adjusting in a clock unit by a correlation calculation between a reference signal and a feedback signal
(2) adjusting in 1/128 clock unit by an error calculation between a reference signal and a feedback signal In step (1) above, a reference signal is delayed in a clock unit, and an amount of delay for the maximum correlation value between the reference signal and the feedback signal is calculated.

Figure 2:
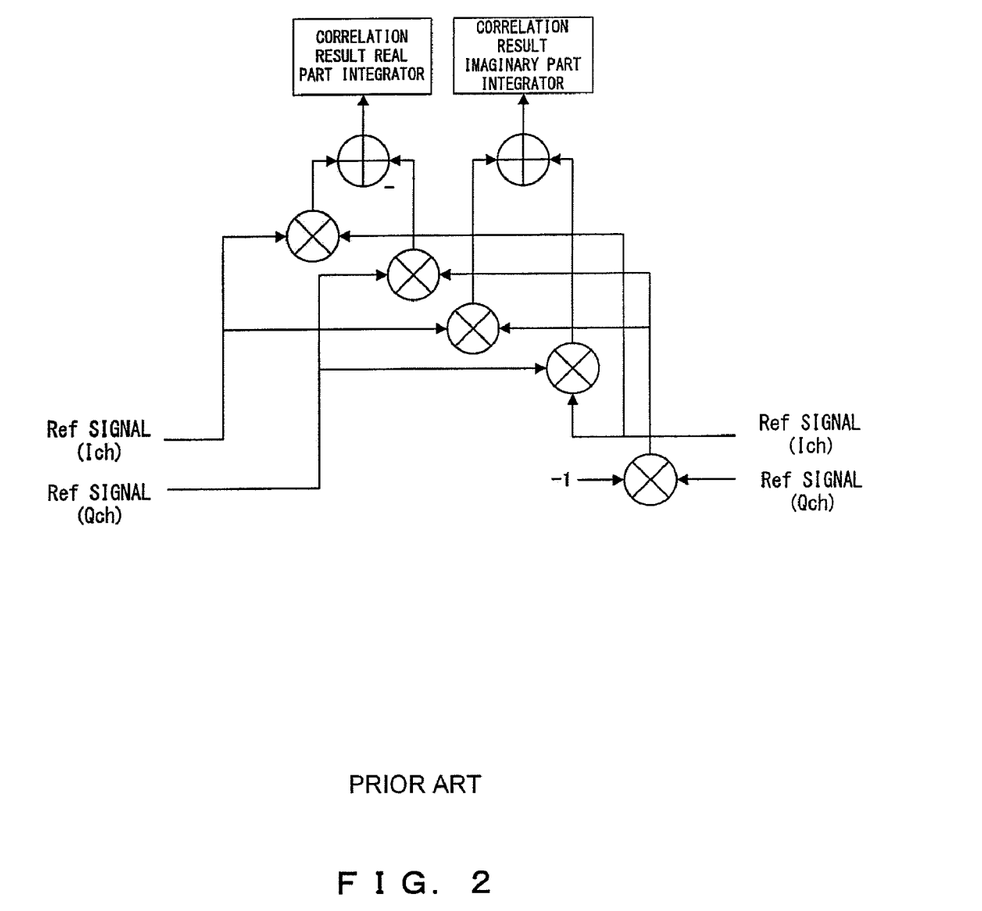
FIG. 2 shows the circuit for performing correlation calculation.

FIG. 2 shows the circuit for performing the correlation calculation.

In FIG. 2, the reference signal and the feedback signal are complex signals each of the signals includes an I signal and a Q signal. Assuming that the I signal of the reference signal is Ref_ich, the Q signal of the reference signal is Ref_qch, the I signal of the feedback signal is FB_ich, and the Q signal of the feedback signal is FB_qch, the calculation performed by the circuit shown in FIG. 2 is expressed by the following equations.

$$Ref = Ref\_ich + jRef\_qch$$

$$FB = FB\_ich + jFB\_qch$$

then $$\text{correlation value} = \Sigma Ref \times FB^* = \Sigma(Ref\_ich + jRef\_qch) \times (FB\_ich - jFB\_qch)$$

where * indicates a complex conjugate, and j indicates an imaginary number unit. A correlation result real part integrator and a correlation result imaginary part integrator perform multiplication on a plurality of calculation results of a real part and an imaginary part of an obtained correlation value, and perform a calculation of a sum of the equations above.

Figure 3:
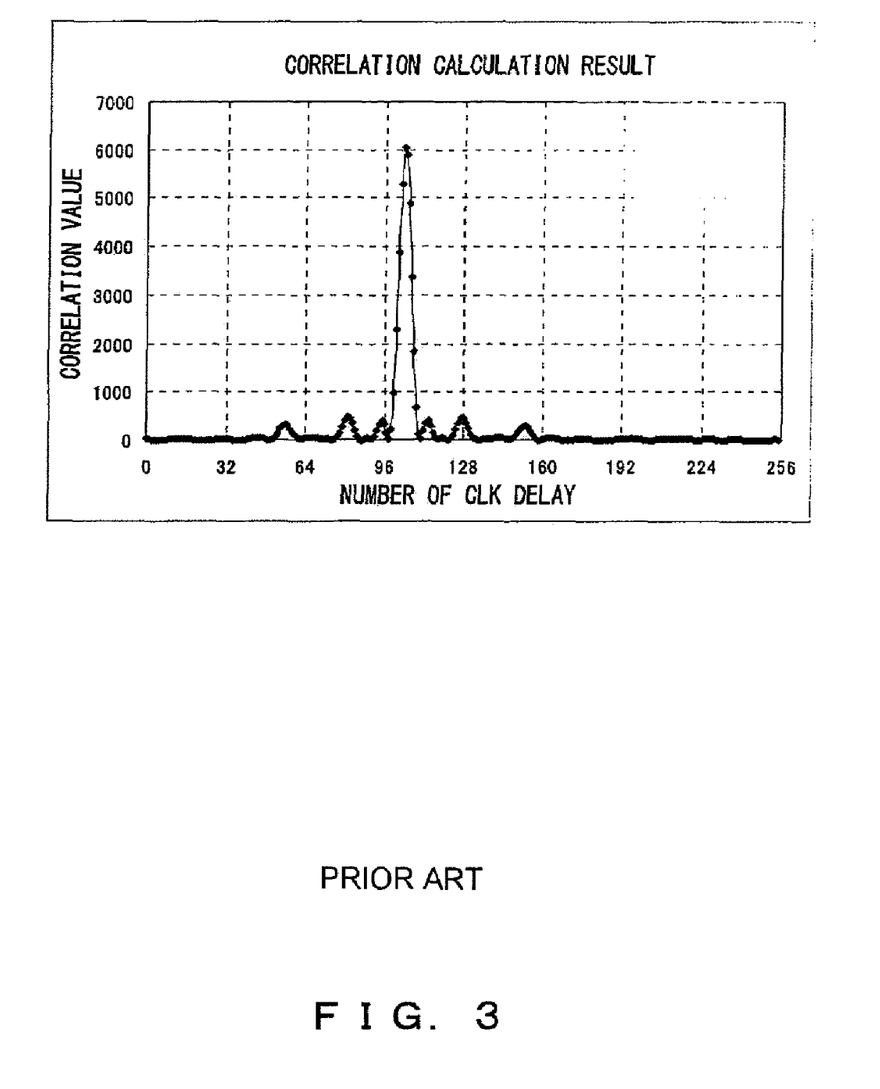
FIG. 3 shows an example of a correlation calculation result.

FIG. 3 shows an example of a result of a correlation calculation.

FIG. 3 shows an example of a result of calculation of a correlation value by assigning various amounts of delay to a reference signal in a clock unit. A correlation value shows peaks at various amounts of delay, and shows the maximum peak value when the relative delay between the reference signal and the feedback signal shows the minimum value. Therefore, by detecting the amount of delay indicating the maximum peak value of the correlation value, the timing between the reference signal and the feedback signal can be detected.

Before performing the process in step (2) above, the amount of delay in a clock unit obtained in step (1) above is set. The correlation calculating unit 18 adjusts the phase of the demodulator 21 on the basis of the set delay. The correlation calculating unit 18 performs the phase adjustment of the demodulator 21 by calculating a phase value as follows.

By the correlation calculation, a phase value indicating the shift of the phase by the relative delay between the feedback signal and the reference signal can be acquired.

Assuming that FB signal = Ref × A exp(−jθ), $$\text{correlation value} = \Sigma Ref \times FB^* = \Sigma Ref \times Ref^* \times A \exp(j\theta) = A \cdot \Sigma |Ref|^2 \exp(j\theta)$$

$$\exp(j\theta) = \cos\theta + j\sin\theta$$

thereby correlation value (real part) = $A \cdot \Sigma |Ref|^2 \cos\theta$ correlation value (imaginary part) = $A \cdot \Sigma |Ref|^2 \sin\theta$ As a result, the phase value is obtained as follows.

$\theta = \tan^{-1}(\text{correlation value}(Qch)/\text{correlation value}(Ich))$ The phase adjustment is performed to eliminate the phase difference between the reference signal and the feedback signal when the error calculation is performed in the delay regulation in step (2) above.

After performing the phase adjustment of the demodulator 21, the delay of the feedback signal is changed using a digital filter (delay filter). A tap coefficient for delay in 1/128 clock unit is prepared for the delay filter. By changing the tap coefficient, the delay of the feedback signal changes, and the optimum delay value of the reference signal and the feedback signal is obtained when a tap coefficient of the filter number indicating the minimum error value is selected.

Figure 4A:
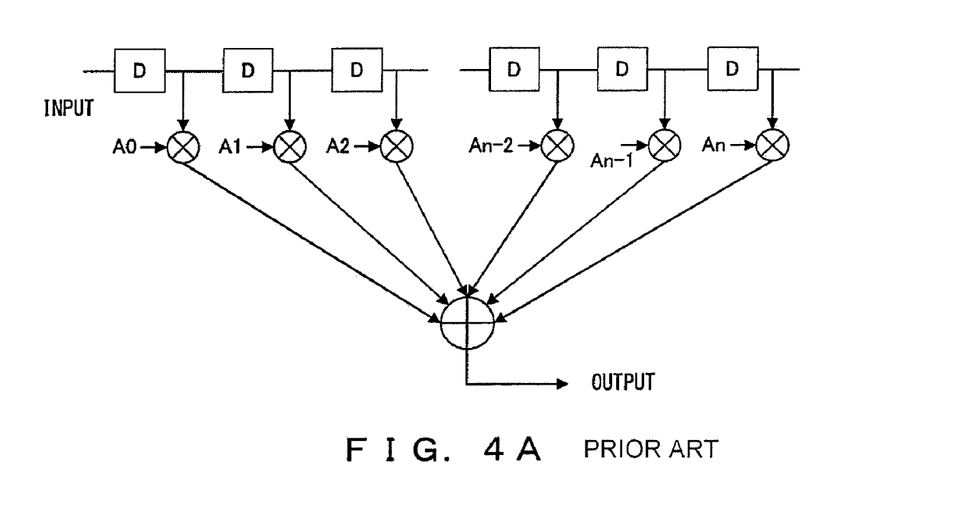
FIGS. 4A and 4B explain a digital filter.
Figure 4B:
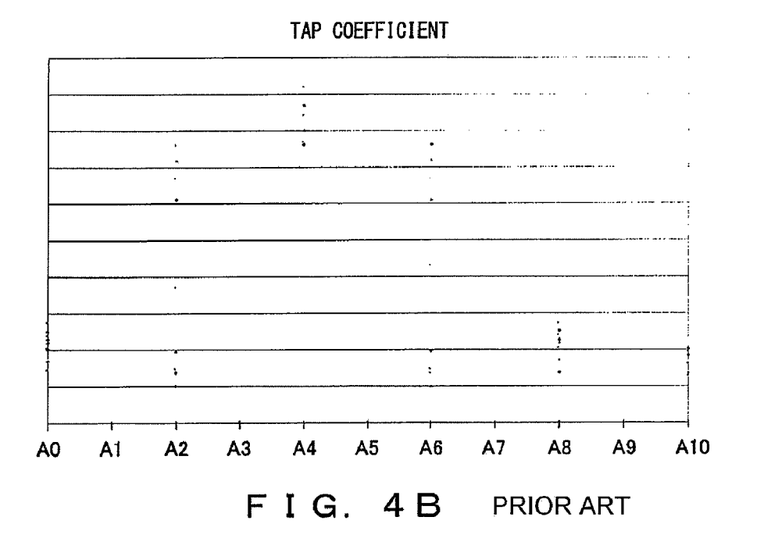

FIGS. 4A and 4B explain a digital filter.

A digital filter is specifically a FIR filter. As shown by FIG. 4A, the digital filter includes a plurality of serially connected delay units, each multiplier for multiplying the output of each delay unit by a tap coefficient A0~An, and an adder for adding up the output of each multiplier and outputting a result. To generate a delay in 1/128 clock unit, 128 delay units are provided. The delay value of each delay is 128 clocks.

FIG. 4B shows an example of a tap coefficient, and is a plot having a vertical axis indicating the value of each tap coefficient when there are 11 taps. Although there are various methods of setting a tap coefficient, an amount of delay depends on the setting of each tap coefficient.

Figure 5:
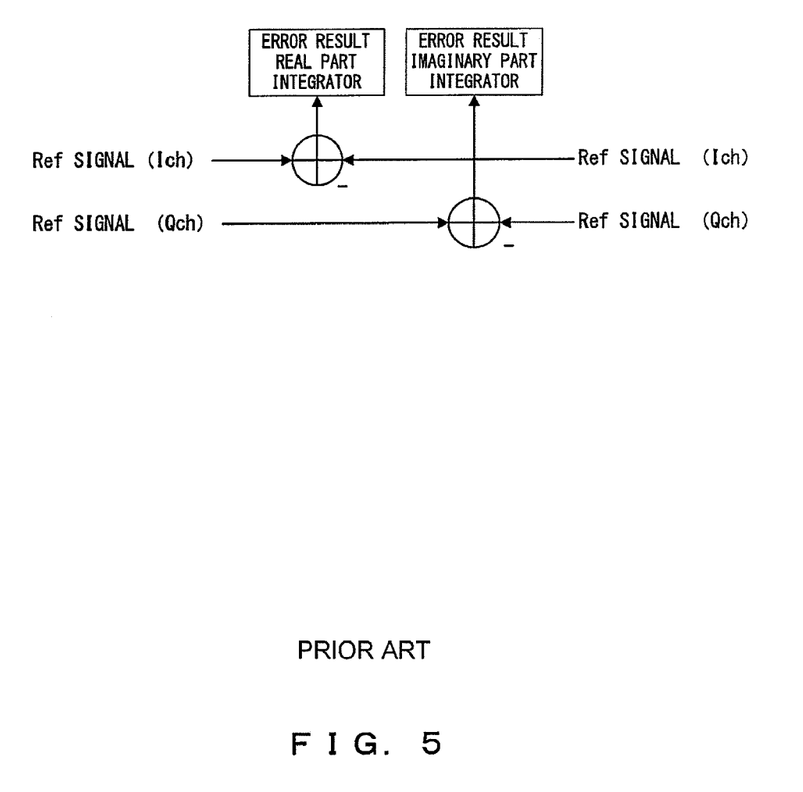
FIG. 5 shows a circuit for performing error calculation.
Figure 6:
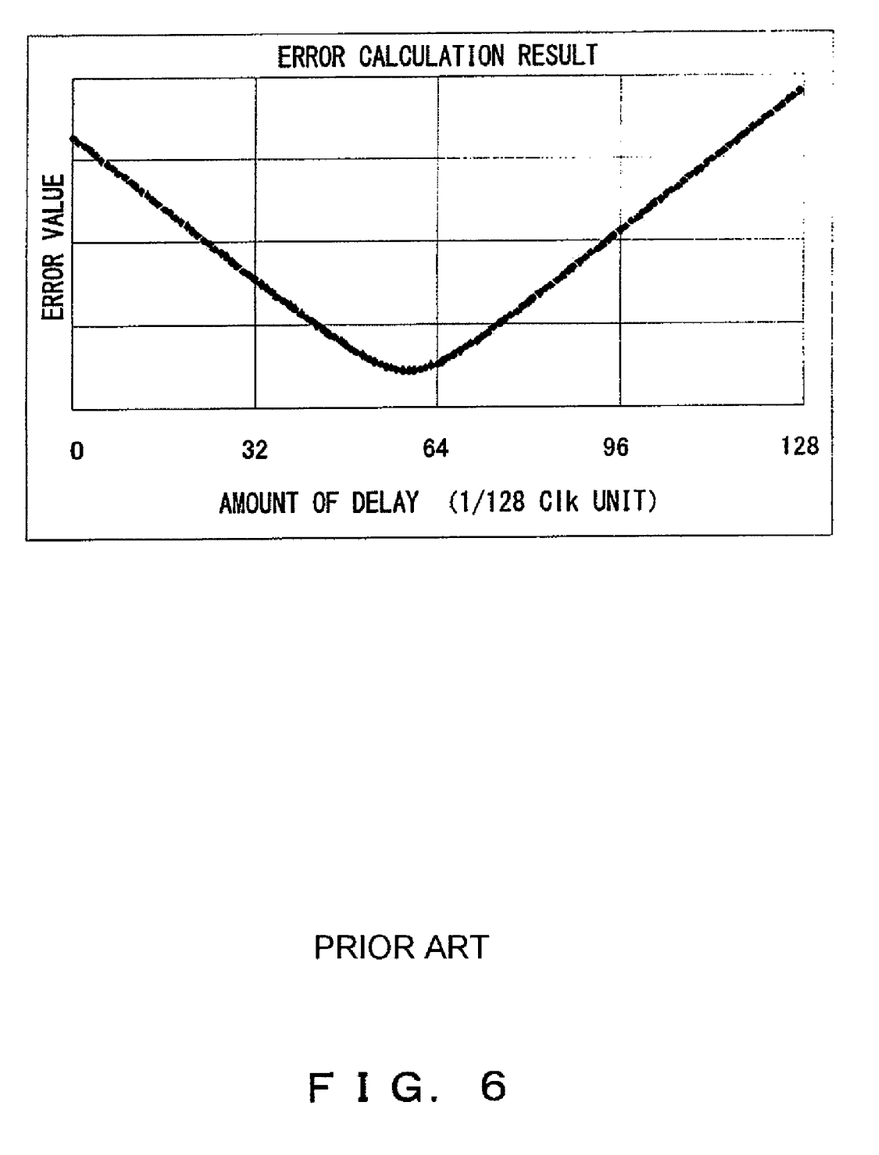
FIG. 6 shows an example of an error calculation result.

FIG. 5 shows an example of a circuit for performing an error calculation, and FIG. 6 shows an example of an error calculation result.

The contents of the calculation by the error calculation circuit shown in FIG. 5 are expressed by the following equations.

Ref=Ref_*ich*+jRef_*qch*

FB=FB_*ich*+jFB_*qch*

Then, an error value is calculated as follows.

$\Sigma\{(\text{Ref\_ich}+j\text{Ref\_qch})-(\text{FB\_ich}-j\text{FB\_qch})\}$

As a result, the real part and the imaginary part of the difference are expressed as follows.

error value(real part)=Σ(Ref_*ich*-FB_*ich*)

error value(imaginary part)=Σ(Ref_*qch*-FB_*qch*)

An absolute value of the error value is obtained.

The name of each variable is the same as that in the description of the correlation calculation. The error result real part integrator and the error result imaginary part integrator obtain a sum of the real part and the imaginary part of the error value.

FIG. 6 shows an amount of delay of a feedback signal in 1/128 clock unit along a horizontal axis, and shows an error value along the vertical axis. The amount of delay indicating the minimum error value is the optimum amount of delay.

However, the conventional system of adjusting an amount of delay has the following problem.

The phase adjustment of the demodulator at the preceding stage of the error calculation in step (2) above is performed using the optimum point of the clock obtained in step (1) above and an initial value delay filter (initial value (0) in 1/128 clock unit), but there is the possibility that the filter tap coefficient of the optimum delay point is different from the delay filter tap coefficient of the initial value. In this case, the phase adjustment is performed with a shifted delay, a correct phase cannot be obtained, thereby failing in obtaining a correct tap coefficient.

Figure 7:
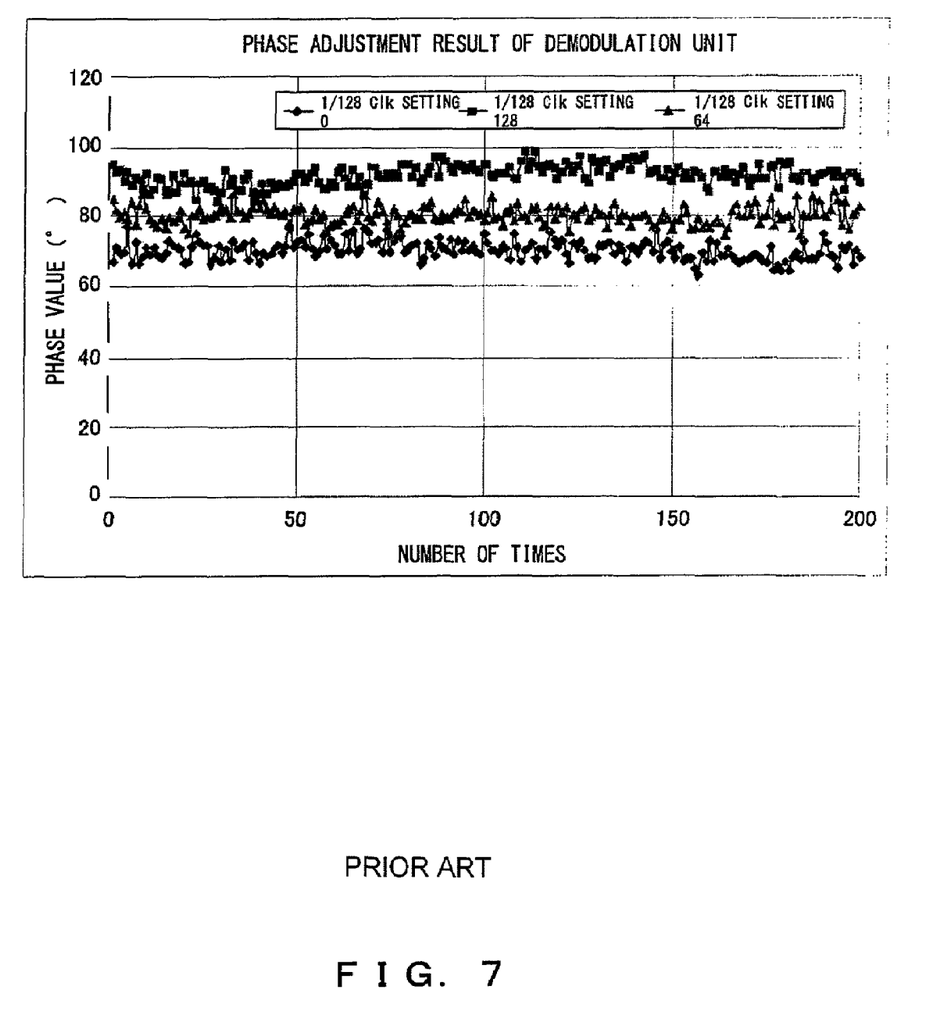
FIG. 7 shows a phase adjustment result of a demodulator using a tap coefficient (delay value)
Figure 8:
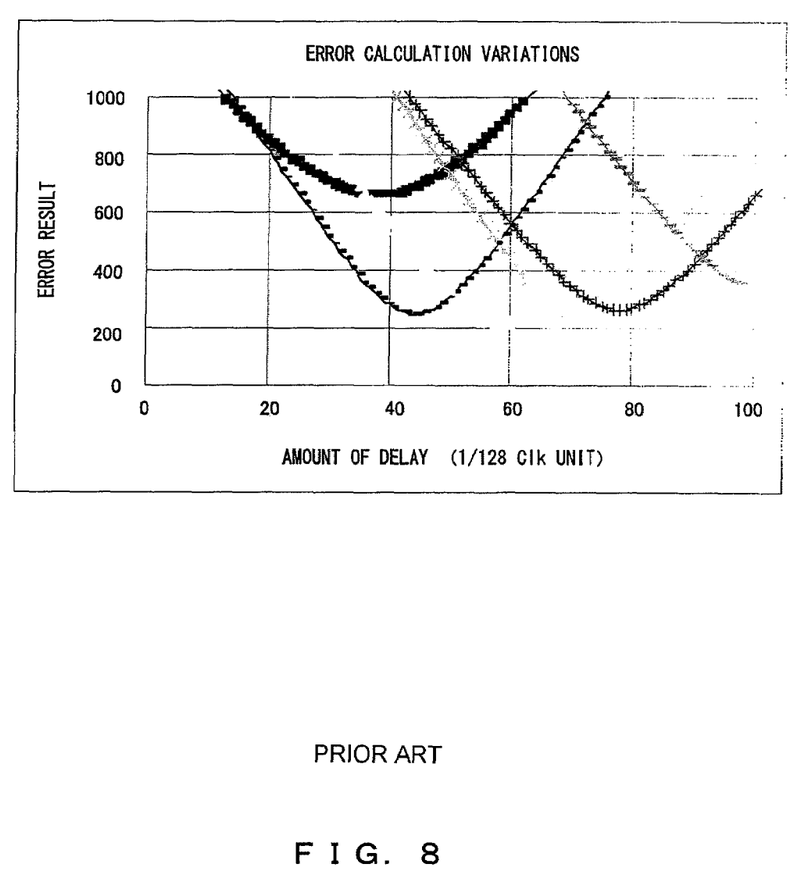
FIG. 8 shows variations of delay regulation results in the error calculation.

FIG. 7 shows the phase adjustment result of the demodulator using a tap coefficient (delay value), and FIG. 8 shows variations of the delay regulation results of the error calculation.

FIG. 7 shows along the horizontal axis the number of times of performing the phase adjusting process, and shows along the vertical axis a change in phase value. The graph shows the three cases of set values of 0, 128, and 64 of the amount of delay in 1/128 clock unit. As shown by the graph, unless the tap coefficient of the delay filter is appropriate, the phase value is not close to 0 although the phase adjusting process is repeated many times.

FIG. 8 shows the case in which a delay regulation is performed using a delay filter on the basis of a result of the error calculation. FIG. 8 shows a result of repeating the trial delay regulation several times, and the graphs using different marks refer to different trials. As shown in FIG. 8, each time trial delay regulation is performed, a different amount of delay brings about the minimum error result, and the optimum reliable amount of delay cannot be obtained only by the delay regulation using an error result.

The conventional distortion compensation device can be the patent document 1. The patent document 1 discloses a technique of not updating a distortion compensation table when a phase value is abnormal.

Patent Document 1: International Patent Application Publication No. WO 03/103166

SUMMARY OF THE INVENTION

The present invention aims at providing a delay regulating device capable of setting the timing of a reference signal and a feedback signal as a reliable and optimum value, and updating a correct distortion compensation coefficient.

The delay regulating device according to the present invention is used in a distortion compensation device for calculating an error signal between a first signal and a second signal and updating a distortion compensation coefficient from the error signal, and adjusts an amount of delay of the first signal and the second signal. The delay regulating device includes: a correlation value calculation device calculating a correlation value between the first signal and the second signal; an error signal calculation device calculating an error signal between the first signal and the second signal; a first delay device adjusting a relative amount of delay between the first signal and the second signal; a second delay device adjusting the relative amount of delay between the first signal and the second signal in a unit smaller than the first delay device; and a control device first setting using the first delay device the relative amount of delay such that the correlation value is maximum, second adjusting using the second delay device the relative amount of delay such that the correlation value is maximum, and third readjusting using the second delay device the relative amount of delay such that the error signal is minimum.

BRIEF DESCRIPTION OF THE DRAWINGS

FIG. 9 shows the state of the amount of delay and the correlation value in 1/128 clock unit;

FIG. 10 shows a result of performing error calculation after performing delay regulation in 1/128 clock unit using a correlation value;

FIG. 11 shows the entire configuration of the apparatus according to the mode for embodying the present invention; and FIG. 12 is a flowchart of the process of the control unit shown in FIG. 11.

DESCRIPTION OF THE PREFERRED EMBODIMENTS

According to this mode for embodying the present invention, the delay regulation is performed in the following procedure to solve the above-mentioned problem.

(1) delay regulation in a clock unit by correlation calculation
(2) filter tap delay regulation in 1/128 clock unit by correlation calculation
(3) filter tap delay regulation in 1/128 clock unit by error calculation The delay regulation in (1) above is not limited to one clock unit. The delay regulation in (2) and (3) is also not limited to the 1/128 clock unit, but can be any unit smaller than the delay regulation unit of (1) above.

By performing the above-mentioned procedure, the correlation calculation of (2) above requires no phase adjustment, thereby performing the filter tap delay regulation without a large shift.

FIG. 9 shows the state of the amount of delay and correlation value in the 1/128 clock unit.

The horizontal axis shows the amount of delay in the 1/128 clock unit, and the vertical axis shows the correlation value. As clearly shown in FIG. 9, a substantially optimum amount of delay can be obtained using a correlation value in the 1/128 clock unit.

If the error calculation is performed by the tap coefficient of the delay filter as a result of the phase adjustment using the result of the optimum amount of delay, the calculation can be performed with a correct phase, and a correct filter tap coefficient can be obtained.

FIG. 10 shows a result of performing the error calculation after performing the delay regulation in the 1/128 clock unit using a correlation value.

In FIG. 10, the horizontal axis shows the amount of delay in the 1/128 clock unit, and the vertical axis shows an error result. Unlike FIG. 8, FIG. 10 shows substantially the same value as the optimum amount of delay although trial processes are repeated many times, and it proves that this method can set a reliable amount of delay. By correctly setting the amount of delay, a distortion compensation coefficient can also be correctly updated. The process of delay regulation can be terminated by the delay regulation in the 1/128 clock unit by the correlation calculation of (2) above. However, FIG. 9 does not show an acute peak of the graph. Therefore, it seems that the peak cannot be easily detected, and correct delay can be obtained by further performing error calculation.

FIG. 11 shows the entire configuration of the apparatus according to the mode for embodying the present invention.

In FIG. 11, the component also shown in FIG. 1 is assigned the same reference numeral, and the description is omitted here.

In FIG. 11, a control unit (CPU) 26 is added. The control unit 26 acquires a correlation value and an error result as a process result from the correlation calculating unit 18 and the error calculating unit 19, and adjusts the amount of delay of the clock unit delay unit 16, the tap coefficient for determination of the amount of delay of the delay filter 20, and the phase of the demodulator 21. The phase adjustment of the demodulator 21 is performed by adjusting the phase of the oscillation wave of the numerical control oscillator 25 for supplying a periodical wave to the demodulator 21.

The contents of the control of the control unit 26 is first acquiring a correlation value from the correlation calculating unit 18, and setting the optimum clock timing using the clock unit delay unit 16. Then, it acquires the correlation value from the correlation calculating unit 18, sets the operation timing using the delay filter 20, and at this time performs the phase adjustment of the demodulator 21. Finally, it acquires an error result from the error calculating unit 19, and sets the delay value as the optimum value using a delay filter.

FIG. 12 is a flowchart of the process performed by the control unit shown in FIG. 11.

When the delay regulation is started, the correlation calculation is started in step S10. The correlation calculation in this case is performed in a clock unit. In step S11, an amount of clock delay is changed. In step S12, a correlation value after the change of the amount of clock delay is acquired. In step S13, it is determined whether or not the amount of clock device has been changed at a specified number of times and a correlation value has been acquired. If the specified number of times has not been reached, control is returned to step S11, and the process is repeated the number of times. If it is determined in step S13 that the specified number of times has been reached, the maximum correlation value is calculated in step S14, and the amount of clock delay is set in step S15. In step S16, the correlation calculation is started. The correlation calculation is performed in a tap unit, that is, in the example above, in the 1/128 clock unit. In step S17, a filter coefficient (tap coefficient) is changed, and a correlation value is changed in step S18. In step S19, it is determined whether or not a specified number of times has been reached. If not, control is returned to step S17, and the process is repeated. If it is determined in step S19 that the specified number of times has been reached, then control is passed to step S20, the maximum correlation value is calculated, and a tap coefficient is set in step S21.

In step S22, error calculation is started. The calculation is performed in a tap unit (for example, in the 1/128 clock unit). In step S23, phase adjustment is performed. In step S24, a filter coefficient is changed. In step S25, an error value is acquired. In step S26, it is determined whether or not the specified number of times has been reached. If not, the process is repeated. If it is determined in step S26 that the specified number of times has been reached, the minimum error value is calculated in step S27, and a tap coefficient is set in step S28, thereby terminating the process.

What is claimed is:

1. A delay regulating device which is used in a distortion compensation device for calculating an error signal between a first signal and a second signal and updating a distortion compensation coefficient from the error signal, and adjusts an amount of delay of the first signal and the second signal, comprising:

a correlation value calculation unit for calculating a correlation value between the first signal and the second signal;

an error signal calculation unit for calculating an error signal between the first signal and the second signal;

a first delay unit for adjusting a relative amount of delay between the first signal and the second signal;

a second delay unit for adjusting the relative amount of delay between the first signal and the second signal in a unit smaller than the first delay unit; and first setting using the first delay unit the relative amount of delay such that the correlation value is maximum, second adjusting using the second delay unit the relative amount of delay such that the correlation value is maximum, and third readjusting using the second delay unit the relative amount of delay such that the error signal is minimum.

2. The device according to claim 1, wherein
the first delay unit adjusts only an amount of delay of the first signal, and the second delay unit adjusts only an amount of delay of the second signal.

3. The device according to claim 2, wherein
the first signal is a reference signal from a baseband signal.

4. The device according to claim 2, wherein
the second signal is a feedback signal obtained by demodulating a transmission signal.

5. The device according to claim 1, wherein
the first delay unit adjusts an amount of delay in a clock unit.

6. The device according to claim 1, wherein
the second delay unit is a digital filter.

7. The device according to claim 1, wherein
the second delay unit adjusts an amount of delay in 1/128 clock unit.

8. The device according to claim 1, wherein
the control unit sets optimum values of relative phases of the first and second signals after a second adjustment and before a third readjustment.

9. A delay regulating method which is used in a distortion compensation device for calculating an error signal between a first signal and a second signal and updating a distortion compensation coefficient from the error signal, and adjusts an amount of delay of the first signal and the second signal, comprising:

providing a first delay unit adjusting a relative amount of delay between the first signal and the second signal;

providing a second delay unit adjusting the relative amount of delay between the first signal and the second signal in a unit smaller than the first delay unit;

calculating a correlation value of the first signal and the second signal;

calculating a error signal of the first signal and the second signal; and first setting using the first delay unit the relative amount of delay such that the correlation value is maximum, second adjusting using the second delay unit the relative amount of delay such that the correlation value is maximum, and third readjusting using the second delay unit the relative amount of delay such that the error signal is minimum.

* * * * *